United States Patent [19]

Schairer

[11] Patent Number: 4,613,890

[45] Date of Patent: Sep. 23, 1986

[54] ALLOYED CONTACT FOR N-CONDUCTING GAALAS-SEMI-CONDUCTOR MATERIAL

[75] Inventor: Werner Schairer, Weinsberg, Fed. Rep. of Germany

[73] Assignee: Telefunken electronic GmbH, Heilbronn, Fed. Rep. of Germany

[21] Appl. No.: 608,725

[22] Filed: May 10, 1984

[30] Foreign Application Priority Data

May 21, 1983 [DE] Fed. Rep. of Germany ....... 3318683

[51] Int. Cl.$^4$ ............................................. H01L 23/54
[52] U.S. Cl. ........................................ 357/67; 357/71; 357/16
[58] Field of Search ..................... 357/71, 67, 16, 18, 357/15, 17, 19; 136/262

[56] References Cited

FOREIGN PATENT DOCUMENTS

| 2245788 | 4/1976 | Fed. Rep. of Germany . |
| 2839235 | 3/1979 | Fed. Rep. of Germany . |
| 2920444 | 4/1982 | Fed. Rep. of Germany . |
| 0016429 | 2/1980 | Japan ..................................... 357/71 |
| 1558764 | 1/1980 | United Kingdom . |

OTHER PUBLICATIONS

"A Monolithic Series-Connected A/0.93Ga0.07 As/-GaAs Solar Cell Array"-Borden American Institute of Physics-Oct. 1979, pp. 553-554.
"A New Heterojunction-gate GaAs Fet"-Umebachi et al-Japanese Journal of Applied Physics, vol. 15, 1976, pp. 157-161.
K. K. Shih and J. M. Blum, "Contact Resistances of Au-Ge-Ni, Au-Zn and Al to III-V Compounds", Solid State Electronics, vol. 15 (1972), pp. 1177-1180.
Patent Abstracts of Japan, vol. 5, No. 197 (E-86) [869], Dec. 15, 1981; and JP-A-56,116,619 (Matsushita) Sep. 12, 1981.
H. J. Hovel et al "Solar Cell Structures", IBM Technical Disclosure Bulletin, vol. 16, No. 7,7, Dec. 1973, pp. 2079-2080.
P. S. Ho et al "Stable Junctions Between GaAs Semiconductors and Metal Contacts Using A Metallic Compound as a Diffusion Barrier", IBM Technical Disclosure Bulletin, vol. 21, No. 4, Sep. 1978, p. 1752.

Primary Examiner—Andrew J. James
Assistant Examiner—S. V. Clark
Attorney, Agent, or Firm—Spencer & Frank

[57] ABSTRACT

The invention relates to an alloyed contact for n-conducting GaAlAs semiconductor material with a high proportion of aluminum. According to the invention, a first layer consisting of a metal from one of the subgroups IVb, Vb or VIb of the periodic table is first applied to the n-conducting semiconductor material, this layer is then covered with a second metal layer consisting of a gold germanium alloy and both layers are alloyed together.

10 Claims, 1 Drawing Figure

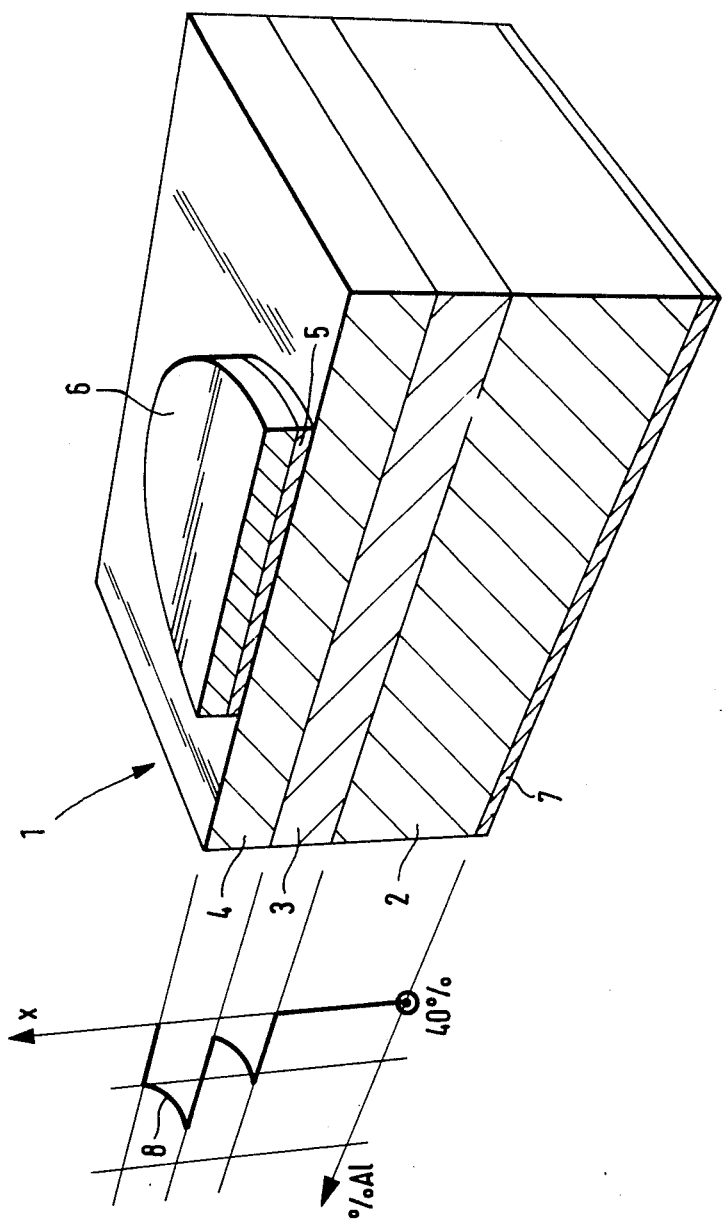

ALLOYED CONTACT FOR N-CONDUCTING GAALAS-SEMI-CONDUCTOR MATERIAL

BACKGROUND OF THE INVENTION

To date, the contact material for n-conducting gallium arsenide, i.e., alloys of gold and germanium or gold and tin, has mainly been used for contacting monocrystalline GaAlAs. Experience has, however, shown that as the aluminum content in the monocrystalline semiconductor material increases, it becomes more and more difficult to make low resistance contacts. More specifically, it has been ascertained that with an aluminum content of 45-55%, gold germanium contacts fail to exhibit any ohmic behavior, which results in unacceptably high contact resistances.

SUMMARY OF THE INVENTION

The object underlying the invention is to provide an alloyed contact for n-conducting GaAlAs semiconductor material with a high aluminum content, with the alloyed contact exhibiting good ohmic behavior, causing low contact resistance and at the same time adhering very well to the monocrystalline semiconductor material. This object is attained in accordance with the invention in that a first layer consisting of a metal from one of the subgroups IVb, Vb, VIb of the periodic table is disposed on the semiconductor material and in that this metal layer is covered by a second metal layer consisting of a gold germanium alloy.

The first metal layer is preferably substantially thinner than the second metal layer and consists, in preferred embodiments, of chromium or titanium. It has been ascertained that in the case of an aluminum content of more than 30 percent in weight in the semiconductor material, this contact exhibits extremely good resistance characteristics which are also maintained when the aluminum content reaches values of 45-55%.

BRIEF DESCRIPTION OF THE DRAWING

The FIGURE is a cross-sectional view of a GaAlAs diode with a contact according to the invention.

DETAILED DESCRIPTION OF THE PREFERRED EMBODIMENT

A GaAlAs diode is shown in the FIGURE. The semiconductor member 1 consists, for example, of a p-conducting gallium arsenide substrate 2 onto which a first epitaxy layer 3 of p-conducting GaAlAs is applied. This p-conducting layer is then covered with a second epitaxy layer 4 of n-conducting GaAlAs.

The aluminum content in the various layers of the semiconductor component is illustrated by a curve 8 at the side of the semiconductor arrangement. As is apparent from the curve 8, the aluminum content at the surface of the n-conducting GaAlAs layer 4 is 40% or more.

The p-conducting gallium arsenide substrate 2 is electrically conductively connected to a contact 7 preferably consisting of a gold zinc alloy. The n-conducting GaAlAs layer 4 is provided with a contact comprised of the layers 5 and 6. A layer 5, preferably consisting of titanium or chromium, is first disposed on the semiconductor surface. The titanium or chromium layer is 3-40 nm thick, while the metal layer 6, consisting of a gold germanium alloy disposed on the titanium or chromium layer 5, has a thickness of between 100 and 1,000 nm.

Aside from titanium or chromium as material for the first metal layer 5, metals such as vanadium, zirconium, niobium, molybdenum, hafnium, tantalum or tungsten may also be used.

To manufacture the semiconductor arrangement according to the FIGURE, the semiconductor surface is cleaned in a suitable solvent after application of the epitaxy layers 3 and 4. The semiconductor arrangement is then placed in a vapor deposition device where a metal mask with the intended contact structure is disposed on the surface to be coated. The surface of the epitaxy layer 4 is prepared for the vapor deposition with titanium in a glow process in argon at several $10^{-4}$ mbar for a duration of 5 minutes. A titanium layer of approximately 15 nm thickness is then vapor deposited to form the layer 6. In a second vapor deposition process, the gold germanium alloy with a layer thickness of approximately 150 nm is then vapor deposited to form the layer 6, with the alloy having a germanium proportion of 2 to 13%.

Finally, the semiconductor arrangement with the vapor deposited contact is subjected to an annealing process at approximately 450° C. for a duration of 10 minutes and the applied metal layer forms an alloy with the semiconductor member. The contact produced in this manner is perfectly ohmic, and the adhesion of the contact to the monocrystalline semiconductor material has proven excellent. With an electron concentration in the range of $n \approx 10^{18}$ cm$^{-3}$ and an Al content of approximately 40%, contact resistances in the range of $2$-$4 \cdot 10^{-4}$ $\Omega$cm$^2$ are obtainable.

What is claimed is:

1. An alloyed contact for n-conducting GaAlAs semiconductor material with a high Al content, wherein a first layer (5) consisting of a metal from one of the subgroups IVb, Vb, VIb of the periodic table is disposed on the semiconductor material (4), and wherein this metal layer is covered by a second metal layer (6) consisting of a gold germanium alloy.

2. An alloyed contact for n-conducting GaAlAs according to claim 1, wherein the first metal layer (5) is substantially thinner than the second metal layer (6).

3. An alloyed contact for n-conducting GaAlAs according to claim 1, wherein the first metal layer (5) consists of chromium or titanium.

4. An alloyed contact for n-conducting GaAlAs according to claim 2, wherein the first metal layer (5) is approximately 3-40 nm and the second metal layer (6) approximately 100-1,000 nm thick.

5. An alloyed contact for n-conducting GaAlAs according to claim 1, wherein the germanium proportion of the gold germanium alloy of the second metal layer (6) is approximately 2-13 percent by weight.

6. An alloyed contact for n-conducting GaAlAs according to claim 1, wherein the Al content of the GaAlAs semiconductor material is higher than 30 percent by weight.

7. An alloyed contact for n-conducting GaAlAs according to claim 2, wherein the first metal layer consists of chromium or titanium.

8. An alloyed ohmic contact for n-conducting GaAlAs semiconductor material with a high Al content wherein: said contact is formed from first and second successive metal layers deposited on a surface of said semiconductor material and alloyed; said first layer is directly disposed on said surface of said semiconductor material, and consists of a metal chosen form one of the subgroups IVb, Vb, and VIb of the periodic table; and said second layer covers said first layer and consists of a gold germanium alloy.

9. An alloyed ohmic contact for n-conducting GaAlAs as defined in claim 8 wherein said Al content of said GaAlAs semiconductor material is greater than 30 percent by weight.

10. An alloyed ohmic contact for n-conducting GaAlAs as defined in claim 9 wherein said Al content of said semiconductor material is at least 40% by weight.

* * * * *